United States Patent
Drohan et al.

(10) Patent No.: US 6,594,002 B2
(45) Date of Patent: Jul. 15, 2003

(54) WAFER SHAPE ACCURACY USING SYMMETRIC AND ASYMMETRIC INSTRUMENT ERROR SIGNATURES

(75) Inventors: William Drohan, Bedford, MA (US); William Goldfarb, Malden, MA (US); Peter Harvey, Wilmington, MA (US); Jaydeep Sinha, Norwood, MA (US)

(73) Assignee: Ade Corporation, Westwood, MA (US)

( * ) Notice: Subject to any disclaimer, the term of this patent is extended or adjusted under 35 U.S.C. 154(b) by 0 days.

(21) Appl. No.: 09/918,979

(22) Filed: Jul. 31, 2001

(65) Prior Publication Data

US 2002/0017911 A1 Feb. 14, 2002

Related U.S. Application Data

(60) Provisional application No. 60/222,130, filed on Jul. 31, 2000.

(51) Int. Cl.[7] .................. G01N 21/00; G01B 9/02; G01B 11/02; G01B 5/28; G06F 19/02
(52) U.S. Cl. .................. 356/73; 356/485; 356/496; 356/504; 702/34; 702/35; 702/36
(58) Field of Search .................. 324/537; 356/485, 356/73, 496, 504; 438/98; 702/35, 36, 34, 40, 81–84, 104, 118, 157, 155, 158, 159, 170, 172, 179, 183

(56) References Cited

U.S. PATENT DOCUMENTS

| | | | |
|---|---|---|---|
| 3,748,602 A | 7/1973 | Delfrate et al. | 333/28 R |
| 5,048,023 A | 9/1991 | Buehler et al. | 714/773 |
| 5,155,633 A | 10/1992 | Grove et al. | 359/834 |
| 5,909,282 A | * 6/1999 | Kulawiec | 356/355 |
| 6,275,297 B1 | * 8/2001 | Zalicki | 356/496 |
| 6,353,473 B1 | * 3/2002 | Ishimori et al. | 356/73 |

* cited by examiner

Primary Examiner—Andrew H. Hirshfeld
Assistant Examiner—Wasseem M. Hamdan
(74) Attorney, Agent, or Firm—Weingarten, Schurgin, Gagnebin & Lebovici LLP

(57) ABSTRACT

A method to determine the systematic error of an instrument that measures features of a semiconductor wafer includes the following sequential steps. Collecting sensor data from measurement runs on front and back surfaces of a wafer while the wafer is oriented at different angles to the instrument for each run, yielding a front data set and a back data set for each angle. Then organizing the data in each set into a wafer-fixed coordinate frame. Reflecting all back surface data about a diameter of the wafer creates a reflected back data set. Subtracting the reflected back data from the front data for each wafer angle, and dividing the result by two, yields an averaged wafer shape for each load angle. Adding the reflected back data to the front data and dividing the result by two, yields an instrument signature for each load angle. The symmetric corrector is calculated by taking the average over all instrument signatures at each load angle. The symmetric corrector is successively rotated to the same angle as a front shape measurement and subtracted, yielding a calibrated wafer data set. A wafer mean is computed by averaging these calibrated wafer shape measurements. When the wafer mean is subtracted from the individual front side corrected shape measurements, a set of shape residual maps for each load angle results. The average of the aligned residuals is the asymmetric error. The systematic error is the sum of the symmetric and asymmetric errors.

14 Claims, 11 Drawing Sheets

(6 of 11 Drawing Sheet(s) Filed in Color)

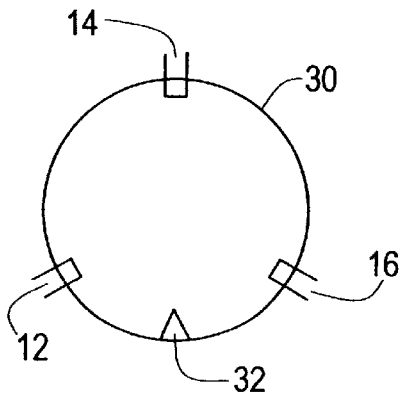
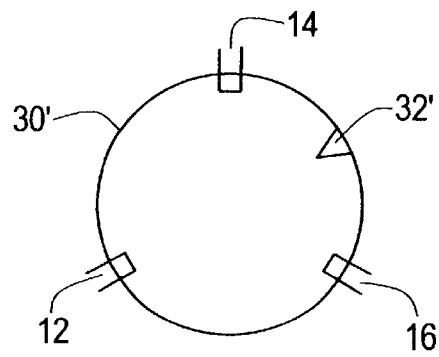
*FIG. 3a*  *FIG. 3b*
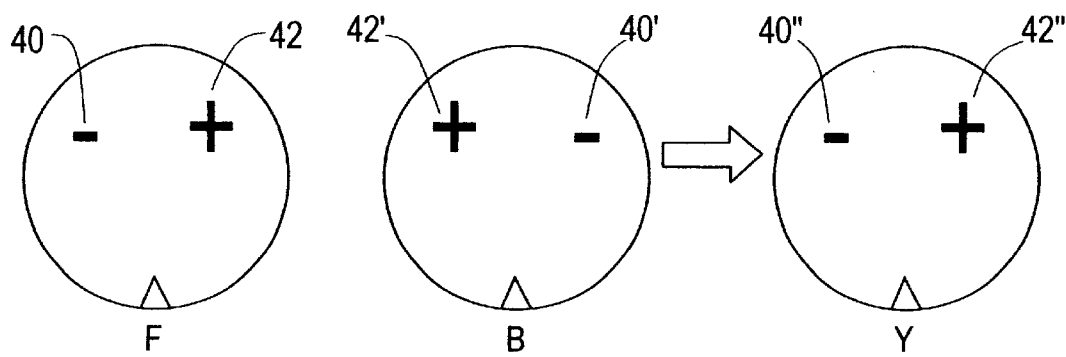
*FIG. 4*

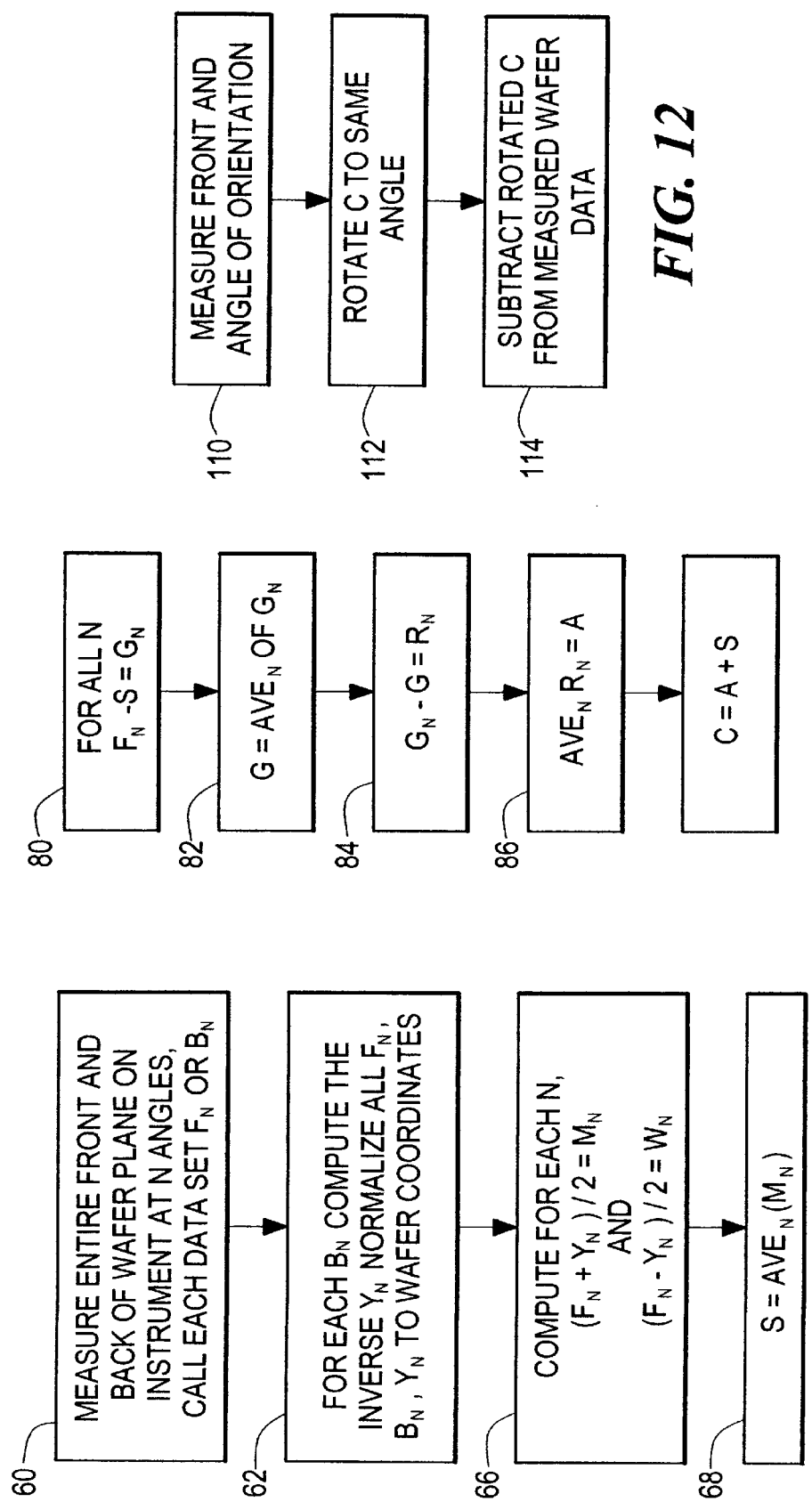

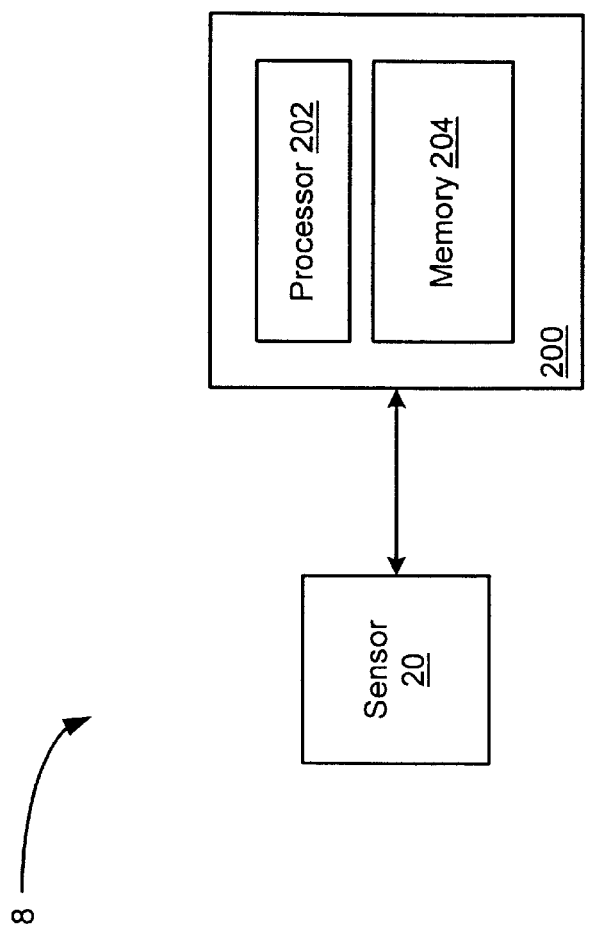

US 6,594,002 B2

WAFER SHAPE ACCURACY USING SYMMETRIC AND ASYMMETRIC INSTRUMENT ERROR SIGNATURES

CROSS REFERENCE TO RELATED APPLICATIONS

This application claims the benefit under 35 U.S.C. §119(e) of U.S. Provisional Application No. 60/222,130, filed Jul. 31, 2000, the entire disclosure of which is incorporated herein by reference.

STATEMENT REGARDING FEDERALLY SPONSORED RESEARCH OR DEVELOPMENT

N/A

BACKGROUND OF THE INVENTION

The present invention relates generally to apparatus and methods of measuring the shape and thickness of wafers, and more specifically to wafer shape and thickness measuring apparatus and methods that employ symmetric and asymmetric instrument error signatures.

Semiconductor circuits are grown on semiconductor wafers that are being manufactured in increasingly larger diameters. The fineness of the circuit lines making up the semiconductor circuits requires a precise focus on an extremely flat wafer. Test equipment has been developed to measure the shape and thickness of wafers, but the quality of the measurement is limited by the error that is induced by the equipment. In test equipment that grips the wafers by the edge and measures the wafer without touching either surface, the measurement precision and consistency have been good when wafers are placed on the test equipment at the same angular orientation. The shape accuracy has not been as good when the wafers are measured at various angular orientations. The measurements from this equipment may be degraded by two types of errors; symmetrical error that is independent of the orientation of the wafer to the grippers and asymmetric error which is correlated with the angular orientation of the wafer on the instrument.

BRIEF SUMMARY OF THE INVENTION

Wafer shape can to be determined with a relatively low spatial frequency resolution. When a wafer is measured while the load angle between measurements is varied, a strong signature that also rotates with the load angle is observed. This instrument signature is independent of the wafer shape and is fairly stationary. A technique that strongly rejects wafer shape can be used to obtain most of this signature, which is called the symmetric signature. The remainder that is not removed by this first step is called the asymmetric signature. The asymmetric instrument signature is evaluated statistically by considering the residual errors in the data. The total corrector is defined by adding both the symmetric and the asymmetric instrument signature. Other aspects, features, and advantages of the present invention are disclosed in the detailed description that follows.

BRIEF DESCRIPTION OF THE SEVERAL VIEWS OF THE DRAWING

The file of this patent contains at least one drawing executed in color. Copies of this patent with color drawing(s) will be provided by the Patent and Trademark Office upon request and payment of the necessary fee.

The invention will be understood from the following detailed description in conjunction with the drawings, of which:

FIGS. 3A–3B are illustrations of a wafer placed on the instrument of FIG. 2 at two different angle orientations;

FIG. 4 is an illustration of the data set taken from a wafer in the front and back surfaces according to the invention;

FIG. 6 is a flow chart of operations to determine the symmetric Error in the data of FIGS. 5A–5D;

FIG. 8 is a flow chart of the method of calculating the asymmetric error corrector and the overall corrector;

FIG. 12 is the flow chart of the procedure used to measure a wafer utilizing the corrector of FIG. 10;

FIG. 16 is a block diagram of a sensor and a computer system included in the measurement gage of FIG. 2.

DETAILED DESCRIPTION OF THE INVENTION

A calibration procedure is described which provides a means to significantly improve the accuracy of semiconductor wafer shape (warp and bow) measurement instruments. The precision and matching of shape measurements on various gages has been good when the wafers are measured at consistent angular orientations relative to the instrument. However, shape accuracy has degraded when the wafers are measured at various angular orientations. Analysis of the data producing the degraded shape accuracy shows a strong and consistent pattern in the range of bow and warp values that correlates with the angular orientations. Since it is advantageous to allow variation in the angular orientation of wafers as they are placed on gages, removing a instrument signature that causes measurement imprecision is desirable.

The repeatable portion of the instrument's signature is determined by a two step computational procedure in which the two dimensional instrument shape error is found as the sum of symmetric and asymmetric components where the symmetry is with respect to an arbitrary diameter line across the circular wafer.

The method has application for wafer shape metrology systems where a wafer moves relative to dimensional sensors that measure a two-dimensional map representing wafer shape. The scan pattern is not necessarily evenly spaced in a Cartesian coordinate frame. The method requires that the location of the wafer fiducial mark be measured.

Wafer shape is a geometric characteristic of semiconductor wafers, which describes the position of the wafer median surface in space. The bow, warp and other shape related parameters of semiconductor wafers are derived from wafer shape and must be within precise tolerances in order for wafers to be usable. The precision and accuracy of dimensional metrology systems should be tight enough to provide the required control over the quality of manufactured wafers.

Figure 1:
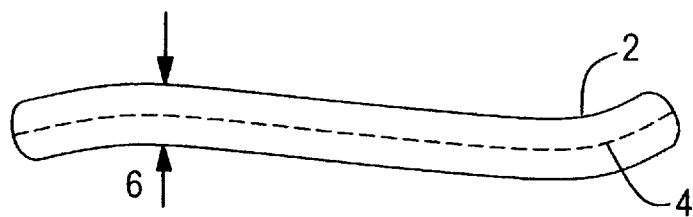
FIG. 1 is a side view of a wafer such as would be tested by the invention.

FIG. 1 illustrates a side view of a wafer 2 with the warp and bow greatly exaggerated. The wafer 2 has a thickness 6 that is measured by determining the distance between the top and bottom surface. The flatness of a wafer 2 is determined by the variation in the thickness 6 of the wafer independent of any warp or bow of the wafer. The wafer median surface 4 is a center plane through the wafer calculated from the thickness 6 measurements. Wafer shape is a geometric characteristic of the semiconductor wafer 2 which describes the position of plane line through the middle of the wafer. This method improves the accuracy of the bow and warp parameters calculated from the wafer shape data. When wafer 2 is measured utilizing edge gripping test equipment, one implementation of the test equipment is illustrated by FIG. 2.

Figure 2:
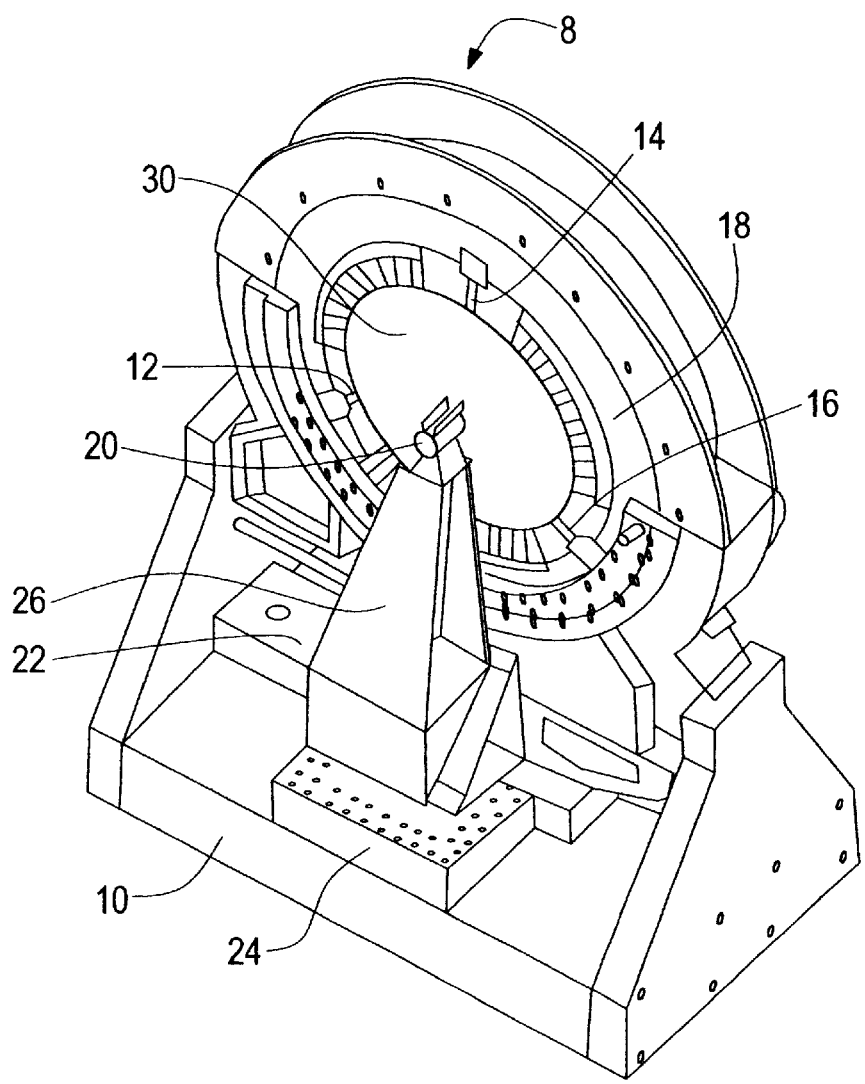
FIG. 2 is a prospective drawing of a non-contact wafer dimensional measurement gage to be calibrated by the invention.

In FIG. 2 the test equipment 8 is securely mounted to a granite block 10 to stabilize the equipment. A wafer 30 is held in the center of an air bearing armature 18 by edge grippers 12, 14 and 16. The air bearing 18 allows the wafer 30 to be spun to bring all points on the wafer 30 within proximity of a sensor 20 mounted at the approximate center of the bearing 18. The sensor 20 is supported by a carriage 24 that slides on a precise reference 22 so the sensor 20 can traverse the entire radius of the wafer 30. In this way the sensor 20 can measure all of the characteristics of the face of the wafer. When a pair of such sensors 20 are used, data can be measured from both the front and the back of the wafer. It is known to monitor the wafer edge to determine the location of a fiducial mark unique to the wafer 30 which then can be used as a reference for angular orientation.

An instrument corrector is that part of the instrument error signature that is systematic. To measure an instrument corrector, data is collected on that instrument using one or more wafers at several orientations (as indicated by the wafer fiducial).

In order to determine the effect on the data collected of the positioning of the wafer on the instrument, wafers are placed in different angular orientations as illustrated by FIGS. 3A–3B. In FIG. 3A, the edge grippers 12, 14 and 16 hold wafer 30 such that the fiducial mark is at a zero reference location. In FIG. 3B, the wafer 30' is mounted at a different orientation such that the fiducial 32' is located between grippers 14 and 16 at the approximate 120 degrees point. Data taken in either of these two positions can be normalized by rotating the data as stored in a Cartesian coordinate grid or by utilizing a co-ordinate system centered on the wafer such as one that places the fiducial mark at a standard position.

Data is taken from both the front and the back of a wafer at a number of angular orientations. For each angular orientation, a pair of data sets of measurements is taken called Front and Back. These are related in two ways: 1) the wafer has been inverted about the plane of the disk; and 2) there is one diameter line where the xy position of the wafer surfaces is unchanged by the operation. In particular, the data set from the wafer front is taken by moving the sensor across the wafer radius as the wafer is spun to create the Front data set. A diameter is selected as an axis of rotation and the wafer is removed from the instrument, turned 180° about the axis of rotation and returned to the machine for the second set of measurements, Back. It is preferable if the rotation diameter line is chosen to coincide with an axis of symmetry of the instrument. For a instrument of the type shown in FIG. 2, where the wafer is held by three grippers arranged at 120-degree spacing, a gripper generally defines a symmetry axis.

For each of the angular orientations, two sets of data are taken as illustrated in FIG. 4. In FIG. 4, data set F represents the data collected from the front of a wafer. For illustration purposes, this wafer has two defects; defect 40 a depression in the front surface and defect 42 an elevation in the front surface. Since these defects are characteristics of the wafer shape, the defects are evident in the data collected from the back of the wafer as well. Data set B represents the data collected from the back of the wafer after the wafer has been rotated about an axis of rotation passing through the fiducial. In data set B, the data collected near defect 42 is on the left side of the fiducial at 42' and the data collected near defect 40 are on the right side of the fiducial at 40'. For computational efficiency, the data set B is inverted about the axis of rotation to create data set Y. In data set Y, the data from defect 40 designated 40" and the data from defect 42 designated as 42" are aligned with the defect data in F.

Figure 5A:
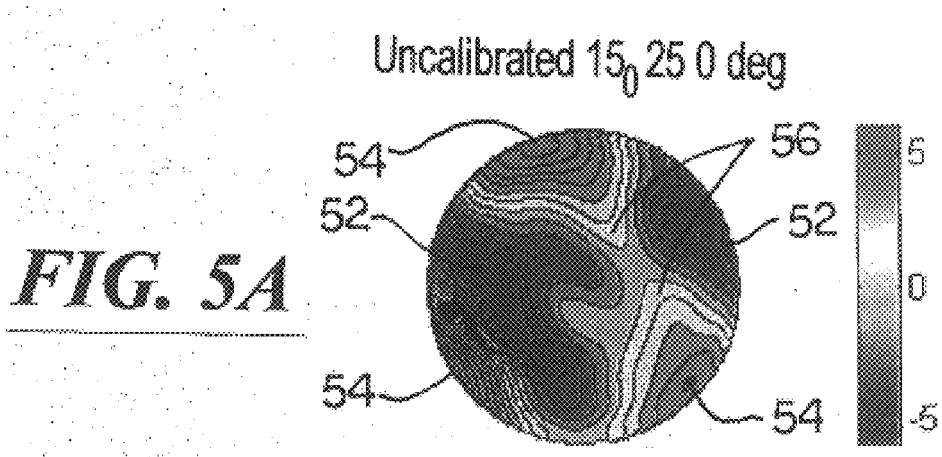
FIGS. 5A–5D are illustrations of the uncalibrated data received from a wafer tested on the equipment of FIG. 2.
Figure 5B:
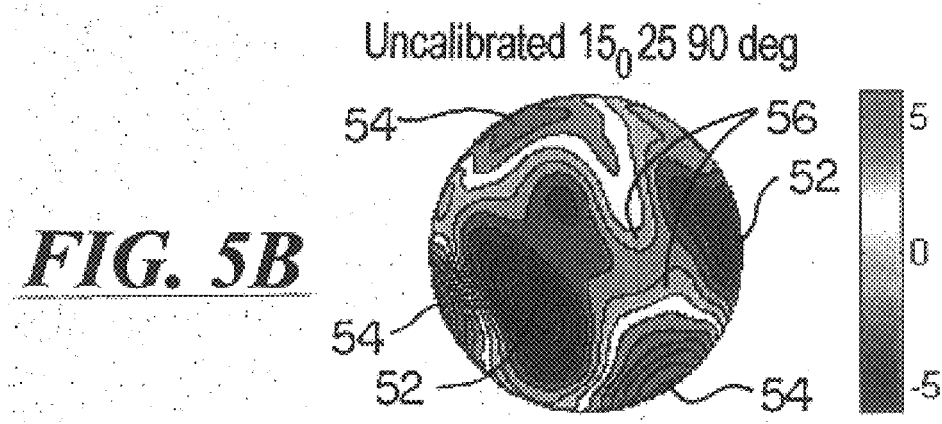
Figure 5C:
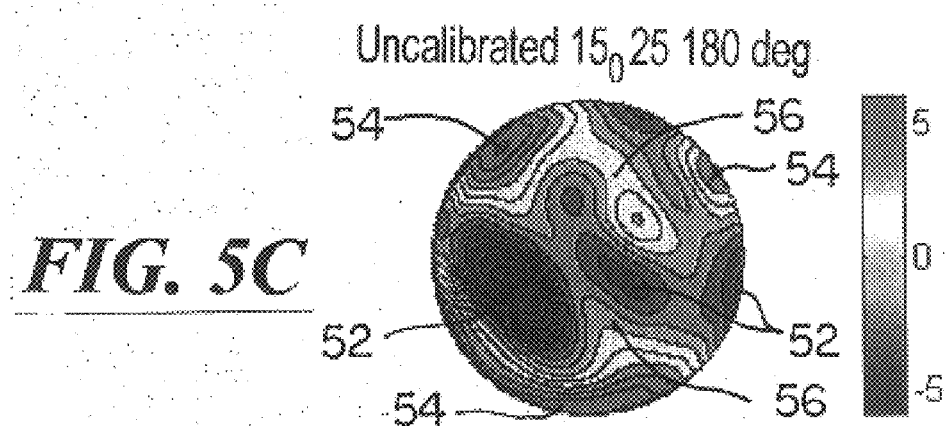
Figure 5D:
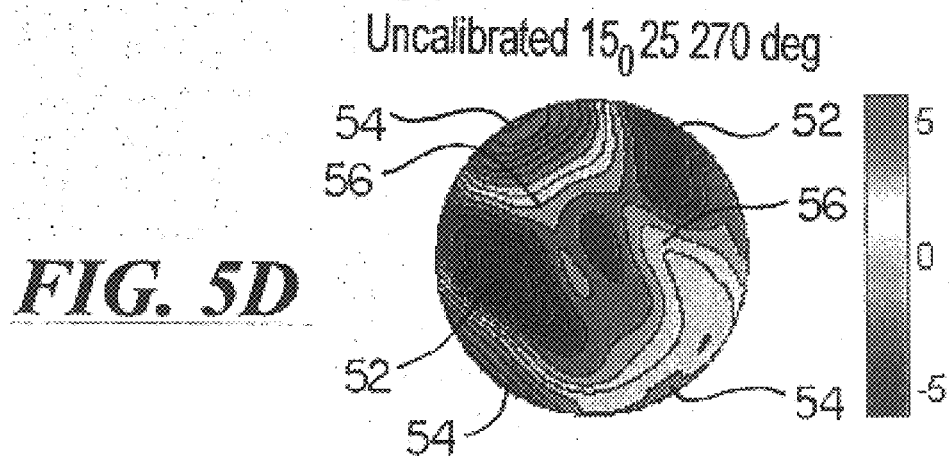

An illustration of the data collected from a wafer placed in four angular orientations is shown in FIGS. 5A–5D. The shape data is obtained from the instrument in a wafer fixed coordinate frame, which rotates with respect to the instrument coordinate frame for different wafer load angles. Therefore each sample measurement contains the instrument signature rotated by the load angle that was used for that particular measurement. These plots show the deviation of the surface from a best fit reference plane. In FIG. 5A the wafer is placed with the fiducial at zero degrees. Low points, i.e., depressions in the shape of the wafer are shown at points 52 facing the left and right of the wafer. High points 54 are approximately at the top and bottom of the wafer, with neutral height contours 56 spread between the two. As the wafer is repositioned so the fiducial is moved by ninety degrees in FIGS. 5B, 5C and 5D, the depressions move and vary in depth, the high points vary more significantly and the neutral contours change the most. From these four pictures, the data appears to be very dependent on position of mounting and it would be difficult to characterize the shape of the wafer with accuracy.

When a wafer is measured with the load angle varied between measurements, a strong signature that also rotates with load angle is observed. When the wafer shape is removed from the data set, the symmetric error can be found. The symmetric instrument signature is estimated as the mean of all the signatures obtained for all load angles from all wafers, with the appropriate rotation angle taken out as appropriate.

The method to estimate the symmetric error is highly wafer independent and can be performed using only one wafer although the accuracy of the signature may be improved by averaging the result from more than one wafer. The method for one wafer is flow charted in FIG. 6. The method involves measuring the entire front and back planes of the wafer on the instrument with the wafer mounted at a specified number of angles. The sets are designated as the front F at an angle n and the back B at an angle n. This step is illustrated in the flow chart at step 60. At step 62 for each Bn an inverse of Bn, Yn is computed where Yn is the data set of Bn symmetrically flipped about the diameter used in flipping the wafer to access the back side. For each angle n, an angled instrument characterization data set In is computed by adding the data sets of Fn and Yn point by point and averaging each point. An angled wafer characterization data set Wn is computed by subtracting Yn from Fn and dividing by two, step 66. The symmetric error corrector for a particular wafer is the average of all of the In's normalized to a common angular position, step 68. If data for more than one wafer is used for the calibration, the new symmetrical error corrector S is the average of the correctors S for each wafer. The systematic error corrector S is defined with an angular orientation usually referenced to the fiducial mark so that later, when wafers are being corrected, the corrector can be oriented to the angle of the wafer mounted on the instrument.

Figures 7, 9:
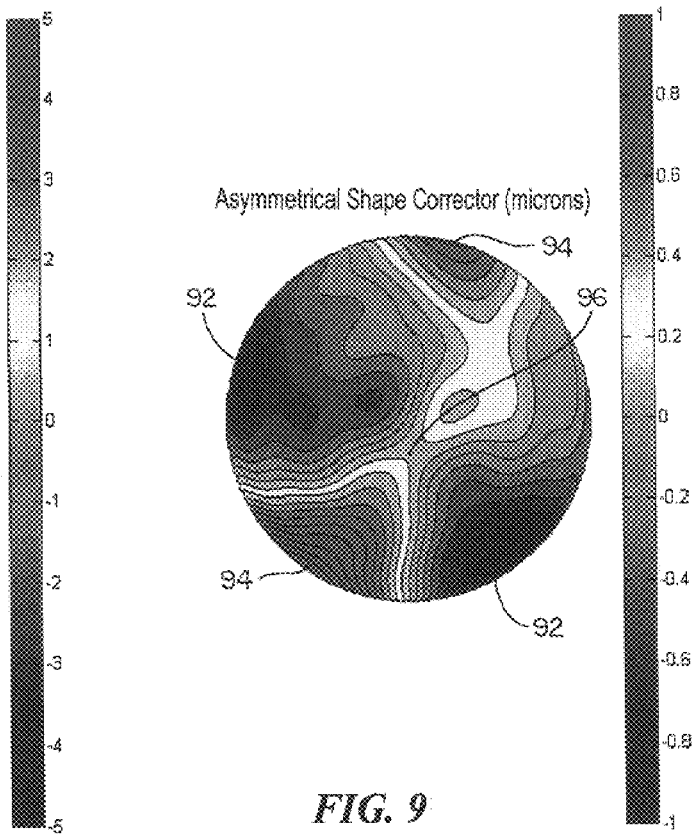
FIG. 7 is a diagram of the symmetric error corrector determined from the data in FIGS. 5A–5D.
FIG. 9 is a diagram of the asymmetric shape corrector determined from the data in FIGS. 5A–5D.

FIG. 7 shows the symmetric shape corrector derived from the raw data of FIGS. 5A–5D. Note that the corrector is symmetrical about the axis starting at zero degrees, the bottom of the wafer, and alternates high points 74 and low points 72 about the wafer. Referring back to FIGS. 3A–3B, the high points 74 are correlated with the approximate position of the edge grippers of the instrument and the low points 72 are correlated with the midpoints between the edge grippers. The neutral position is located approximately in the middle of the wafer. Once the symmetric shape corrector S has been determined, the asymmetric shape corrector can be found utilizing the same data.

Symmetrically calibrated wafer signals for each load angle are obtained by subtracting the symmetric instrument signature from each of the front side measurements, with appropriate load angle rotation applied. The results are observed to be quite stationary (very little load angle effect), but not perfectly stationary, indicating some residual asymmetric instrument signature.

FIG. 8 is the flow chart for calculating the asymmetric and overall shape correctors. In step 80, for each angle n, the shape corrector S is oriented to the angle of the data set and subtracted from data set Fn, leaving the data sets Gn called the generated calibrated wafers. The average of the Gn's for each wafer is taken by aligning the Gn's and then taking an average of the data set called G, as shown in step 82. The residual error in the calibrated wafers is computed by subtracting G from the individual Gn's of that wafer, accounting for the orientation of the two wafers. This leaves a residue Rn based on the angular orientation as shown in step 84. The average of the residues Rn after they are oriented to discount for the angular placement is the asymmetric shape corrector A, step 86. If more than one wafer is used for the calibration, the average of the individual A's form a more accurate A. The overall shape corrector C is computed by aligning data sets A and S and adding them together, step 90.

FIG. 9 illustrates the asymmetric shape corrector associated with the raw data from FIGS. 5A–5D. The asymmetric shape corrector does not show the influence of the gripper positions as the symmetric shape corrector did and although there are low points 92 and high points 94 they are not necessarily correlated with a known feature of the instrument.

Figure 10:
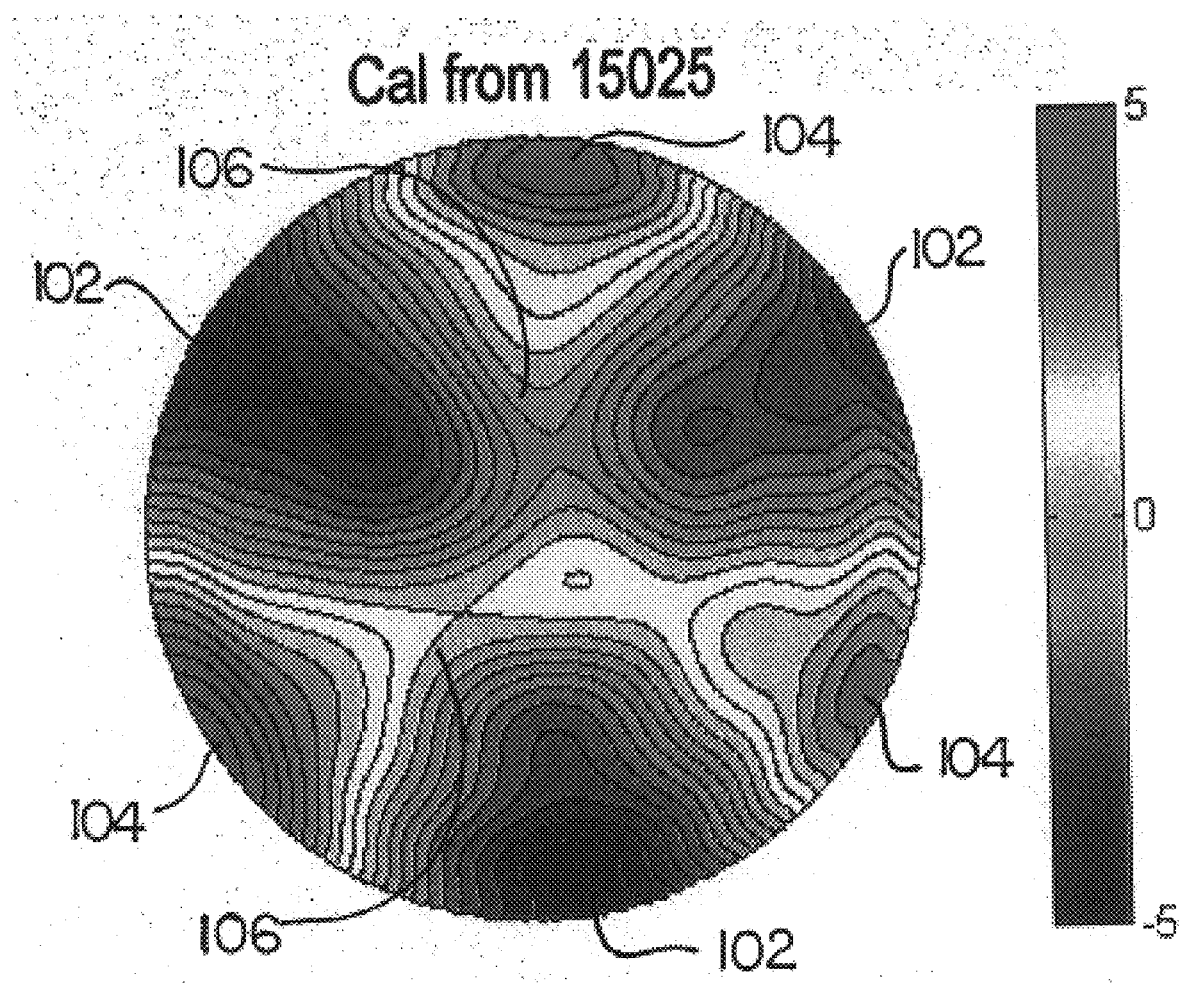
FIG. 10 is a diagram of the overall error corrector derived from the calculations of FIGS. 6 and 8.

The total corrector for the data set of FIGS. 5A–5D is shown in FIG. 10. Here the symmetrical corrector defects of the grippers are seen at 104 but the effects are modified by the effects of the asymmetric shape corrector of FIG. 9. Similarly low points 102 are interposed around the edge of the wafer between high points 104 arid the neutral position is approximately in the center of the wafer.

Figure 11:
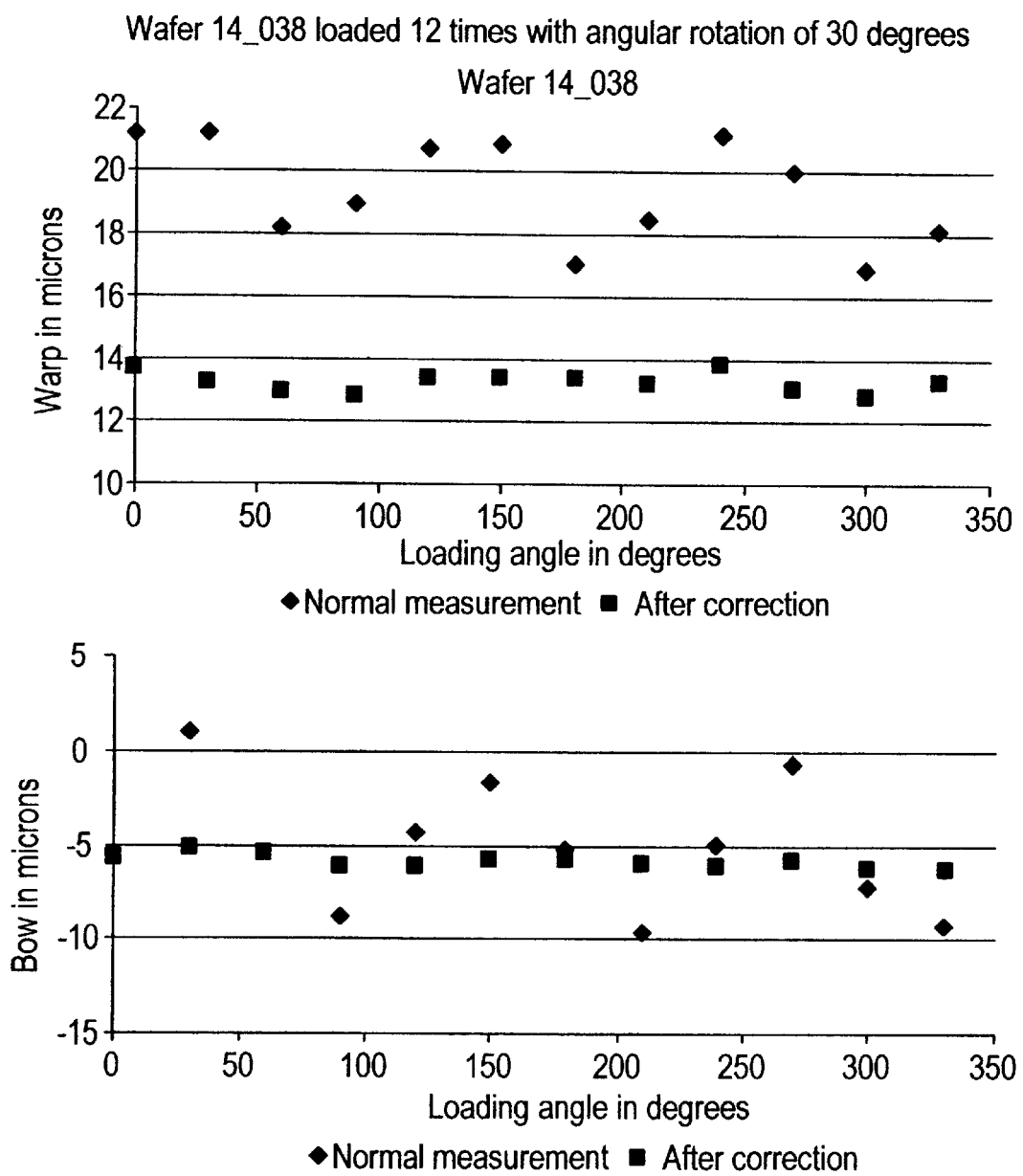
FIG. 11 is a comparison of the warp and bow measurements before and after the correction of FIG. 10.
Figure 13A:
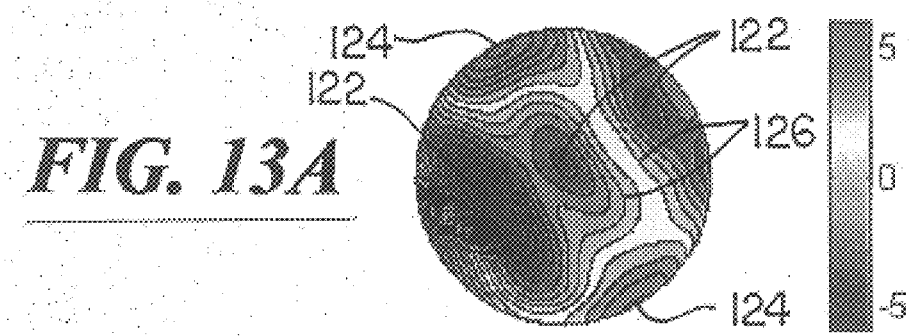
FIGS. 13A–13D are the processed data from FIGS. 5A–5D after the error corrector of FIG. 10 is applied.
Figure 13B:
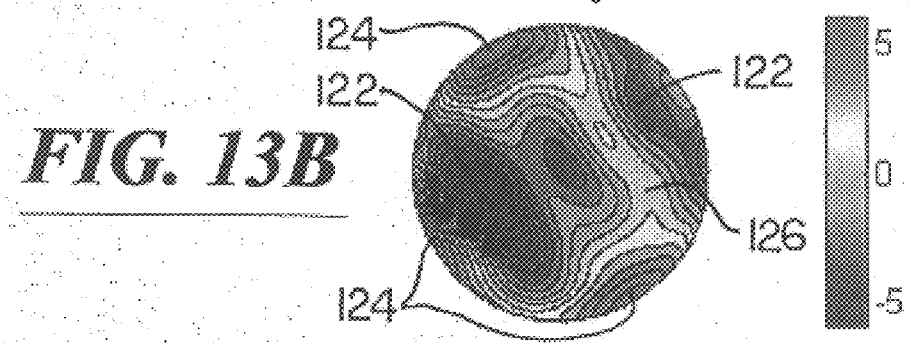
Figure 13C:
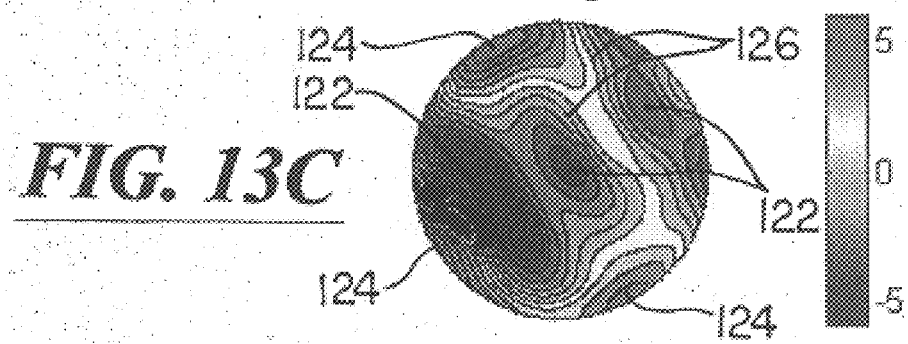
Figure 13D:
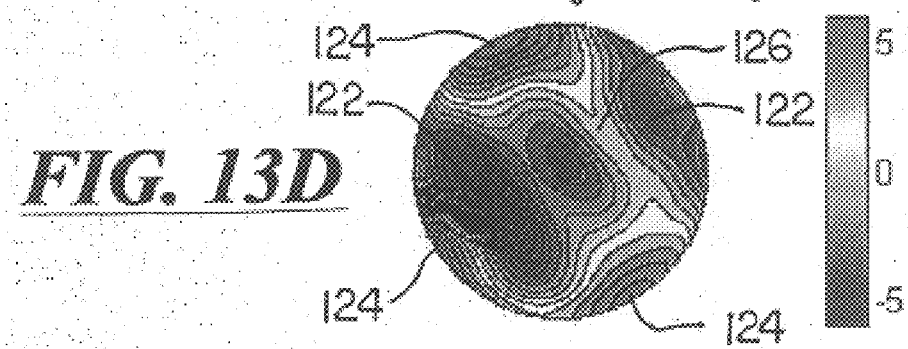

To see the real shape data of the calibrated wafers, the total calibration corrector C is adjusted for wafer orientation and subtracted from the Fn data collected at the beginning of the process. After this correction is done only non-reproducible measurement errors remain. The resultant wafer data is much improved in accuracy because the instrument distortion has been removed. FIG. 11 illustrates this improvement in accuracy. The uncalibrated data (diamonds) shows a warp and bow standard deviation of 1.66 and 3.362 microns respectively. The corrected data shows a standard deviation of 0.309 and 0.313 microns for warp and bow respectively.

Application of the corrector to a measurement task is shown in the flow chart of FIG. 12. When wafers are being measured they are placed on the instrument and the angle of placement relative to the zero position is noted, step 110. The measurement data is collected for the front of the wafer only. The overall corrector that is stored for the instrument is rotated to the same angle as the wafer under test, step 112. The corrector is then subtracted from the measured data to yield the corrected wafer data.

As shown in FIG. 16, the test equipment 8 further comprises a computer system 200 including at least one processor 202 operative to execute programmed instructions out of a memory 204. For example, the instructions executed in performing the functions herein described may comprise instructions stored as program code considered part of one or more applications for estimating the symmetric error (as described above with reference to FIG. 6), for calculating the asymmetric and overall shape correctors (as described above with reference to FIG. 8), and for applying the corrector to a measurement task (as described above with reference to FIG. 12). It is noted that the memory 204 may comprise Random Access Memory (RAN), or a combination of RAM and Read Only Memory (ROM).

The corrected data for the wafers of FIGS. 5A–5D are illustrated in FIGS. 13A–13D with the angles of placement oriented identically. In contrast to FIGS. 5A–5D, the data for all positions in FIGS. 13A–13D is relatively consistent exhibiting a low point 122 at the lower left quadrant, a second low point toward the center of the wafer and a third low point toward the upper right quadrant with two high points 124 at the upper left and lower left quadrants and a neutral position interposed between the low and high points. The data from FIGS. 13A–13D illustrates that a wafer can be measured with consistency without regard to the angle of placement of the wafer on the instrument.

Figure 14A:
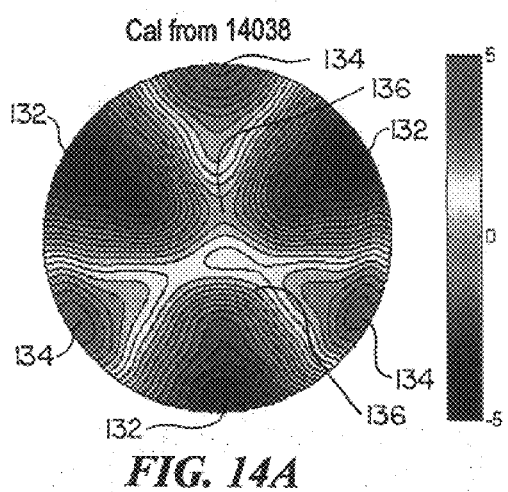
FIGS. 14A–14B illustrate the error corrector derived utilizing a number of wafers.
Figure 14B:
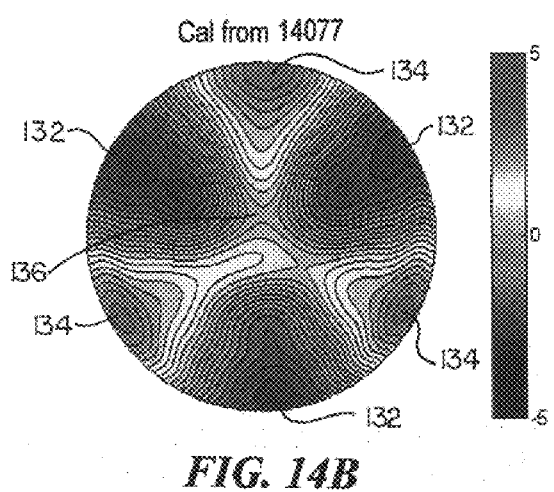
Figure 15:
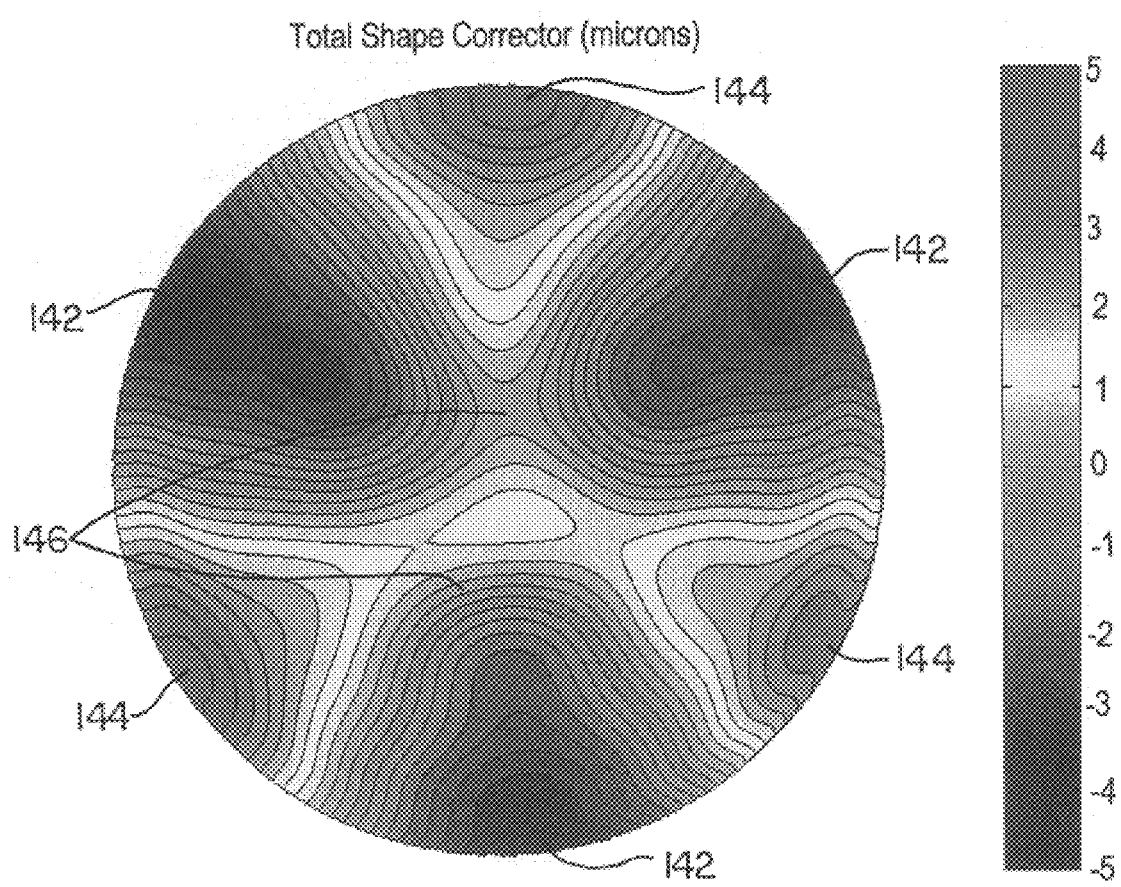
FIG. 15 is the total shape corrector derived utilizing the three shape correctors as illustrated in FIGS. 10 and 14A–14B.

FIGS. 14A–14B illustrate the corrector calculated for the same instrument but with different wafers in FIG. 14A and 14B. When compared with the corrector of FIG. 10, all the correctors show low points 102 and 132 at similar positions and high points 104 and 134 at similar positions and the neutral area forming approximately the same corrector. The average of these three correctors is shown in FIG. 15 where the high points 144 and low points 142 and neutral areas 146 are well defined.

In an alternate implementation, the data may be transformed in a preliminary step by being filtered to remove high spatial frequency variation (this generally represents only mechanical vibration and other noise) and mapped to a regular Cartesian grid as is known in the art.

As has been described above, according to this method, there is a procedure to remove both the symmetric and asymmetric error signatures of an instrument from the wafer shape data measured by the instrument. The accuracy of silicon wafer shape measurements can be significantly improved by introducing a calibration corrector. This improvement carries forward into the derived warp and bow parameters.

Having described preferred embodiments of the invention it will now become apparent to those of ordinary skill in the art that other embodiments incorporating these concepts may be used. Accordingly, it is submitted that the invention should not be limited by the described embodiments but rather should only be limited by the spirit and scope of the appended claims.

What is claimed is:

1. A method of determining the symmetric error of a measurement instrument that measures features of a semiconductor wafer, the method comprising;

collecting sensor data from a number of measurement runs on a front and back surfaces of a wafer wherein the wafer is oriented at a different angle relative to the instrument for each run, yielding a front data set and a back data set for each angle;

organizing the data in each set into a wafer-fixed coordinate frame;

reflecting all back surface data about a diameter of the wafer creating a reflected back data set;

for each wafer angle, subtracting the reflected back data from the front data and dividing the result by two, yielding an angled wafer average;

for each wafer angle, adding the reflected back data to the front data and dividing the result by two, yielding an angled instrument average; and calculating a symmetric error signature by taking the average of all angled instrument averages.

2. The method of claim 1 further computing an asymmetrical error signature comprising:

from each angled front data set subtracting the symmetric error signature after rotating the symmetric error signature to the corresponding angle, yielding an angled symmetric calibrated wafer data;

aligning the angled symmetric calibrated wafer data and averaging them for the angles yielding a wafer mean;

subtracting the wafer mean from each angled symmetric wafer data yielding an angled residual; and aligning the angled residuals and averaging them for the angles yielding an asymmetric error.

3. The method of claim 2 further comprising the step of adding the asymmetric error and the symmetric error yielding a corrector.

4. The method of claim 1 wherein the measurement data is taken for a number of wafers and the symmetric corrector is computed as the average of the individual wafer correctors.

5. The method of claim 1 wherein the number of measurement runs each at a different angle is 3 runs.

6. The method of claim 1 wherein the measured data has high frequency noise removed from it before further processing.

7. A method of measuring a wafer, comprising the steps of:

measuring at least one wafer shape characteristic of a first side of the wafer to obtain a first set of data by a measurement instrument, the measuring step including noting an angle of orientation of the wafer relative to the measurement instrument;

conceptually rotating a second data set to correspond to the same angle of wafer orientation as the first data set; and subtracting the conceptually rotated second data set from the first data set to yield a third data set.

8. A system for determining the symmetric error of a measurement instrument that measures features of a semiconductor water, the system comprising;

at least one processor including an input/output device for collecting digitized data from the measurement instrument; and a memory device containing a computer program operable to:

collect sensor data from a number of measurement runs on a front and back surfaces of a wafer wherein the wafer is oriented at a different angle relative to the instrument for each run, yielding a front data set arid a back data set for each angle;

organize the data in each set into a wafer-fixed coordinate frame;

reflect all back surface data about a diameter of the wafer creating a reflected back data set;

for each wafer angle, subtract the reflected back data from the front data and divide the result by two, yielding an angled wafer average;

for each wafer angle, add the reflected back data to the front data arid divide the result by two, yielding an angled instrument average; and calculate a symmetric error signature by taking the average of all angled instrument averages.

9. The system of claim 8 further operable to compute an asymmetrical error signature, the memory device further containing a computer program operable to:

from each angled front data set, subtract the symmetric error signature after rotating the symmetric error signature to the corresponding angle, yielding an angled symmetric calibrated wafer data;

align the angled symmetric calibrated wafer data and average them for the angles yielding a wafer mean;

subtract the wafer mean from each angled symmetric wafer data yielding an angled residual; and align the angled residuals and average them for the angles yielding an asymmetric error.

10. The system of claim 9 further operable to add the asymmetric error and the symmetric error yielding a corrector.

11. The system of claim 8 wherein the digitized data is collected for a number of wafers and the symmetric corrector is computed as the average of the individual wafer correctors.

12. The system of claim 8 wherein the number of measurement runs each at a different angle is 3.

13. The system of claim 8 wherein the digitized data has high frequency noise removed from it before further processing.

14. A system for measuring a wafer on a measurement instrument, the system comprising:

a sensor configured to measure at least one wafer shape characteristic of at least one side of the wafer;

at least one processor configured to collect digitized data corresponding to the at least one measured wafer shape characteristic; and a memory device containing at least one computer program communicably coupled to the processor, wherein the processor is further configured to execute the computer program to control the sensor to measure the at least one wafer shape characteristic to obtain a first set of data, including noting an angle of orientation of the wafer relative to the measurement instrument;

conceptually rotate a second data set to correspond to the same angle of wafer orientation as the first data set; and subtract the conceptually rotated second data set from the first data set to yield a third data set.

* * * * *

UNITED STATES PATENT AND TRADEMARK OFFICE
CERTIFICATE OF CORRECTION

PATENT NO. : 6,594,002 B2
DATED : July 15, 2003
INVENTOR(S) : William Drohan et al.

It is certified that error appears in the above-identified patent and that said Letters Patent is hereby corrected as shown below:

<u>Title page,</u>
Item [73], Assignee, "Ade Corporation" should read -- ADE Corporation --;

<u>Column 6,</u>
Line 31, "(RAN)" should read -- (RAM) --;

<u>Column 8,</u>
Lines 6 and 16, "arid" should read -- and --.

Signed and Sealed this

Ninth Day of March, 2004

JON W. DUDAS
*Acting Director of the United States Patent and Trademark Office*